United States Patent
Matsuura (10) Patent No.: US 7,800,187 B2
(45) Date of Patent: Sep. 21, 2010

(54) TRECH-TYPE VERTICAL SEMICONDUCTOR DEVICE HAVING GATE ELECTRODE BURIED IN ROUNDED HUMP OPENING

(75) Inventor: Naoki Matsuura, Ohtsu (JP)

(73) Assignee: NEC Electronics Corporation, Kanagawa (JP)

( * ) Notice: Subject to any disclaimer, the term of this patent is extended or adjusted under 35 U.S.C. 154(b) by 337 days.

(21) Appl. No.: 11/435,754

(22) Filed: May 18, 2006

(65) Prior Publication Data

US 2006/0267085 A1 Nov. 30, 2006

(30) Foreign Application Priority Data

May 19, 2005 (JP) ............................. 2005-146529

(51) Int. Cl.
*H01L 21/336* (2006.01)
*H01L 21/3205* (2006.01)

(52) U.S. Cl. ..................... 257/409; 257/E27.091; 257/E29.2; 257/E29.201; 257/E27.095; 257/E29.26; 438/270; 438/271; 438/272; 438/589

(58) Field of Classification Search ......... 438/270–272, 438/589; 257/401, 409, E27.091, E29.2, 257/E29.201, 364, E27.095, E29.26
See application file for complete search history.

(56) References Cited

U.S. PATENT DOCUMENTS

| 5,937,296 | A * | 8/1999 | Arnold ..................... 438/270 |
| 6,075,269 | A * | 6/2000 | Terasawa et al. ........... 257/330 |
| 6,284,604 | B1 * | 9/2001 | Tihanyi .................... 438/268 |
| 6,342,709 | B1 * | 1/2002 | Sugawara et al. .......... 257/139 |
| 7,470,588 | B2 * | 12/2008 | Cho et al. ................. 438/272 |
| 2005/0116217 | A1 * | 6/2005 | Jones et al. ................ 257/19 |
| 2005/0242392 | A1 * | 11/2005 | Pattanayak et al. ......... 257/328 |

FOREIGN PATENT DOCUMENTS

| JP | 2000-58823 | 2/2000 |
| JP | 2001-244325 | 9/2001 |

* cited by examiner

*Primary Examiner*—Hsien-ming Lee
*Assistant Examiner*—Kevin Parendo
(74) *Attorney, Agent, or Firm*—Young & Thompson (57) ABSTRACT

In a semiconductor device including a gate electrode buried in a trench of the device, the trench is constructed by a first opening with a uniform width the same as that of an upper portion of the first opening and a second opening beneath the first opening with a width larger than the uniform width. A bottom of a base region adjacent to the trench is adjacent to the second opening.

7 Claims, 14 Drawing Sheets

TRECH-TYPE VERTICAL
SEMICONDUCTOR DEVICE HAVING GATE
ELECTRODE BURIED IN ROUNDED HUMP
OPENING

BACKGROUND OF THE INVENTION

1. Field of the Invention

The present invention relates to a trench-type vertical semiconductor device such as a trench-type vertical metal oxide semiconductor (MOS) transistor and a trench-type vertical insulated gate bipolar transistor (IGBT).

Generally, since trench-type vertical MOS transistors and IGBTs are easy to control and have negative temperature coefficient ON-currents, they have been used as power semiconductor devices for driving inductance loads such as motors and solenoid values in automobiles. When such inductance loads are driven by the above-mentioned MOS transistors or IGBTs, it is important that an avalanche breakdown phenomenon caused by the inductance loads should be suppressed.

2. Description of the Related Art

A first prior art trench-type vertical semiconductor device is constructed by gate electrodes buried in trenches each of which has a uniform width. In this case, the bottom of a base region reaches an intermediate portion of each of the trenches. This will be explained later in detail.

In the above-described first prior art semiconductor device, however, a breakdown current flows due to the counter-electromotive force of an inductance load to turn ON a parasitic bipolar transistor. As a result, the breakdown current is concentrated on the base region, which would destroy the semiconductor device.

In a second prior art semiconductor device (see: JP-2000-058823-A), impurity diffusion regions are added to the first prior art semiconductor device, so that the turning-ON of the parasitic bipolar transistor is suppressed, so that the destruction of the semiconductor device can be suppressed. This also will be explained later in detail.

In the above-described second prior art semiconductor device, however, when the added impurity diffusion regions are close to the gate electrodes, i.e., the channel regions of a MOS transistor, the cut-off voltage and ON-resistance of the MOS transistor would be increased. Also, the breakdown voltage characteristics would deteriorate. Thus, it is difficult to control the depth and impurity concentration of the added impurity diffusion regions.

In a third prior art semiconductor device (see: JP-2001-244325-A), rounded hump openings are provided at the bottoms of trenches thus relaxing the current concentration, which would suppress the reduction of a gate breakdown voltage.

SUMMARY OF THE INVENTION

In the above-described third prior art semiconductor device, however, it is impossible to avoid an avalanche breakdown phenomenon. That is, since the base region does not reach the rounded hump openings of the trenches, the breakdown current flows to turn ON the parasitic bipolar transistor. Also, since the depth of the trenches is larger than that of the base region, a non-flat depletion region is generated at the bottom of the base region caused by a reverse bias voltage applied thereto, which would decrease the breakdown voltage. Further, since the current path of the MOS transistor is relatively long, its ON-resistance is increased.

According to the present invention, in a semiconductor device including a gate electrode buried in a trench of the device, the trench is constructed by a first opening with a uniform width the same as that of an upper portion of the first opening and a second opening beneath the first opening with a width larger than the uniform width. A bottom of a base region adjacent to the trench is adjacent to the second opening.

Also, in a method for manufacturing a trench-type semiconductor device, a first etching mask is formed on a semiconductor layer of a conductivity type on a semiconductor substrate. Then, an anisotropic etching operation is performed upon the semiconductor layer using the first etching mask to generate a first opening in the semiconductor layer. Then, a second etching mask is formed on a sidewall of the opening. Finally, an isotropic etching operation is performed upon the semiconductor layer using the first and second etching masks to further generate a second opening in the semiconductor layer at a bottom of the first opening. Thus, a trench is constructed by the first and second openings.

BRIEF DESCRIPTION OF THE DRAWINGS

The present invention will be more clearly understood from the description set forth below, as compared with the prior art, with reference to the accompanying drawings, wherein.

DESCRIPTION OF THE PREFERRED EMBODIMENTS

Before the description of the preferred embodiments, prior art semiconductor devices will be explained with reference to FIGS. 1, 2, 3, 4, 5 and 6.

Figure 1:
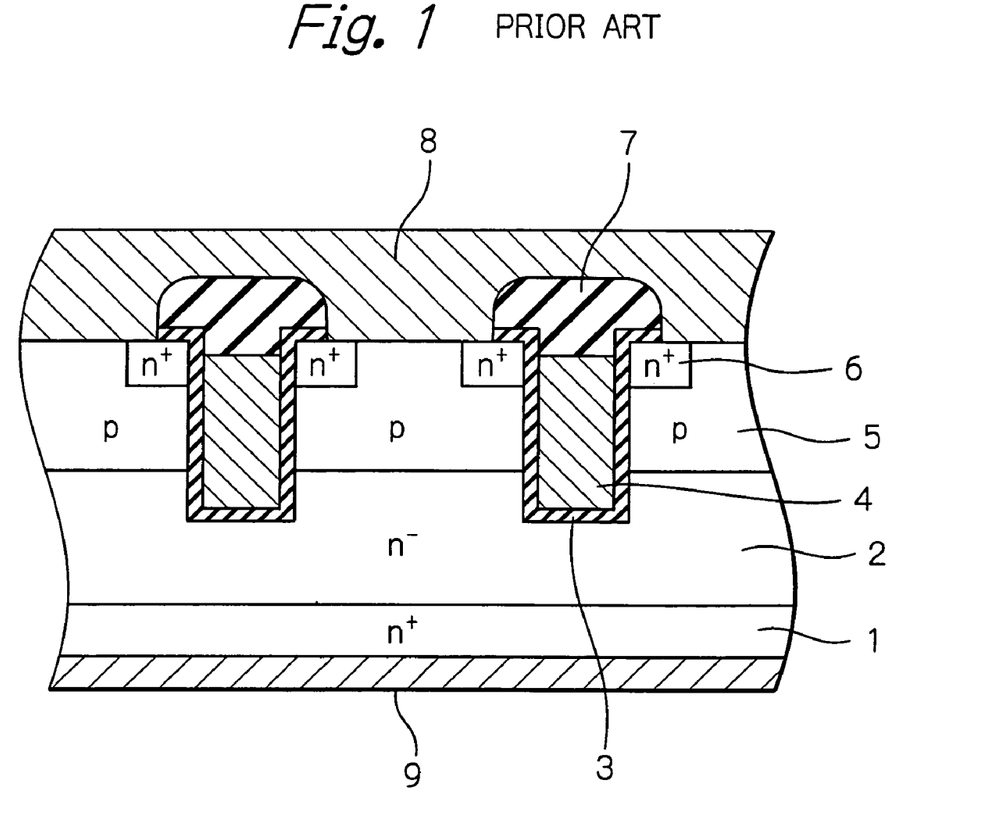
FIG. 1 is a cross-sectional view illustrating a first prior art semiconductor device.

In FIG. 1, which illustrates a first prior art semiconductor device such as a trench-type vertical MOS transistor, reference numeral 1 designates an n$^+$-type monocrystalline silicon substrate on which an n$^-$-type epitaxial silicon layer 2 is grown. Also, trenches (grooves) are formed in the n$^-$-type epitaxial silicon layer 2. Gate silicon dioxide layers 3 are formed on inner walls of the trenches, and gate electrodes 4 are buried in the trenches on the gate silicon dioxide layers 3. Further, formed within the n$^-$-type epitaxial silicon layer 2 is a p-type base region 5 which surrounds the trenches. Additionally, n$^+$-type source impurity diffusion regions 6 are formed within the p-type base region 5. Still further, an insulating layer 7 made of silicon dioxide is formed on the gate silicon dioxide layers 3 and the gate electrodes 4, and a source electrode 8 is formed on the insulating layer 7 and connected to the n$^+$-type source impurity diffusion regions 6. On the other hand, after the back face of the n$^+$-type silicon substrate 1 is etched, a drain electrode 9 is formed on the back face of the n$^+$-type silicon substrate 1.

Figure 2:
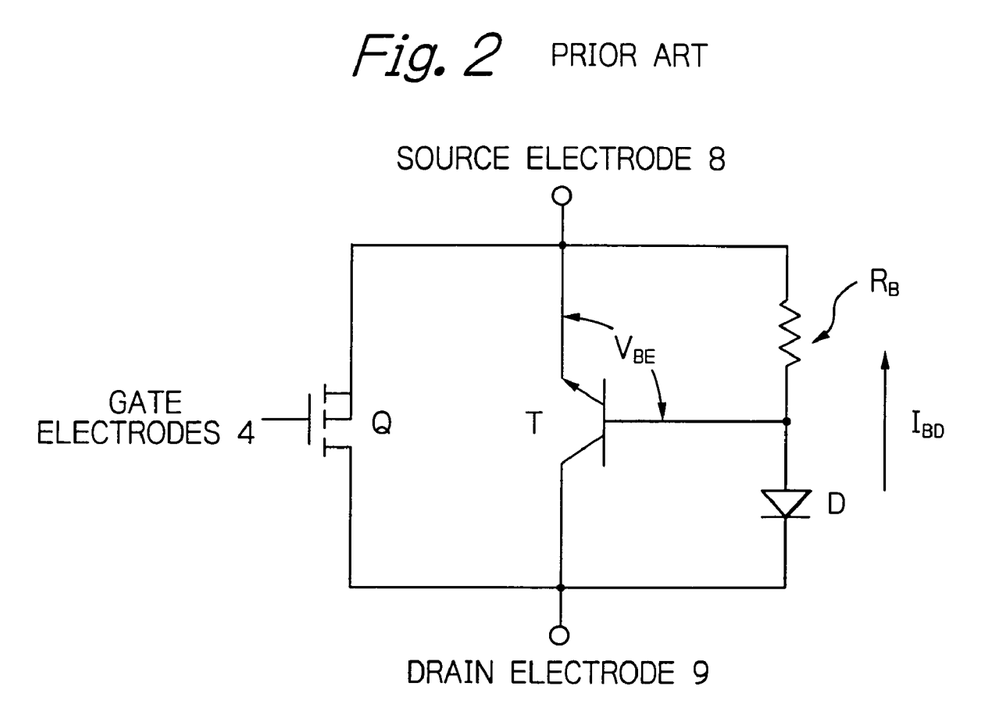
FIG. 2 is an equivalent circuit diagram of the semiconductor device of FIG. 1.

As illustrated in FIG. 2, which is an equivalent circuit diagram of the semiconductor device of FIG. 1, the n$^+$-type source impurity diffusion regions 6, the gate electrodes 4 and the n$^-$-type epitaxial silicon layer 2 form a MOS transistor Q, and the n$^+$-type source impurity diffusion regions 6, the p-type base region 5 and the n$^-$-type epitaxial silicon layer 2 form a parasitic npn-type bipolar transistor T. Also, in FIG. 2, reference D designates a pn diode formed by the p-type base region 5 and the n$^-$-type epitaxial silicon layer 2, and R$_B$ designates a base resistance defined by the p-type base region 5 surrounded by the n$^+$-type source impurity diffusion region 6.

Figure 3:
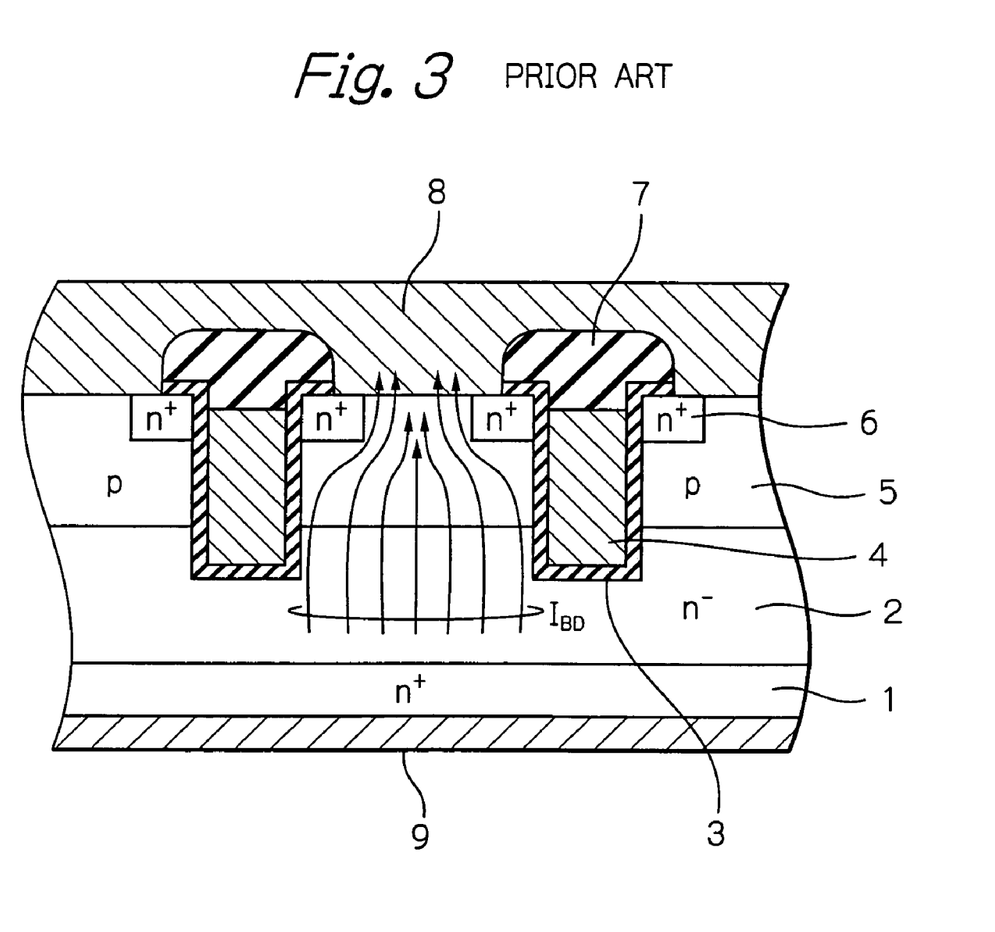
FIG. 3 is a cross-sectional view for explaining the current concentration of a breakdown current in the semiconductor device of FIG. 1.

When the MOS transistor Q is turned OFF, an avalanche breakdown phenomenon would occur. That is, when the MOS transistor Q is turned OFF, a breakdown current I$_{BD}$ flows through the diode D and the base resistance R$_B$ due to the counter-electromotive force of an inductance load (not shown) connected to the source electrode 8 or the drain electrode 9, so that the base-to-emitter voltage V$_{BE}$ rises to turn ON the parasitic npn-type bipolar transistor T. As a result, as illustrated in FIG. 3, the breakdown current I$_{BD}$ is concentrated on the p-type base region 5 surrounded by the n$^+$-type source impurity diffusion regions 6 to increase its current density, which would destroy the semiconductor device of FIG. 1.

The above-mentioned avalanche breakdown phenomenon is true for a trench-type vertical IGBT having a similar structure to that of the semiconductor device of FIG. 1.

Figure 4:
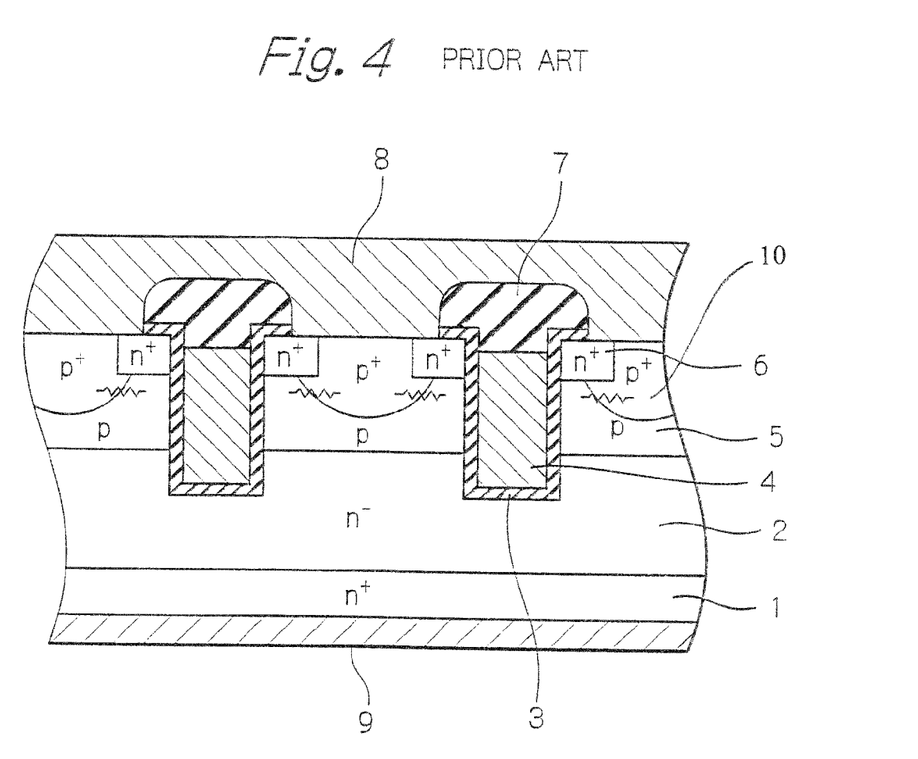
FIG. 4 is a cross-sectional view illustrating a second prior art semiconductor device.

In FIG. 4, which illustrates a second prior art semiconductor device (see: JP-2000-058823-A), p$^+$-type impurity diffusion regions 10 are provided in the semiconductor device of FIG. 1, so that the base resistance R$_B$ of FIG. 2 is decreased. As a result, the turning-ON of the parasitic npn-type bipolar transistor T is suppressed, so that the destruction of the semiconductor device of FIG. 4 can be suppressed.

In the semiconductor device of FIG. 4, however, when the p$^+$-type impurity diffusion regions 10 are close to the gate electrodes 4, i.e., the channel regions of the MOS transistor Q, the cut-off voltage and ON-resistance of the MOS transistor Q would be increased. Also, when the p$^+$-type impurity diffusion regions 10 reach the n$^-$-type epitaxial silicon layer 2, the breakdown voltage characteristics of the pn diode D would deteriorate. Thus, it is difficult to control the depth and impurity concentration of the p$^+$-type impurity diffusion regions 10.

Figure 5:
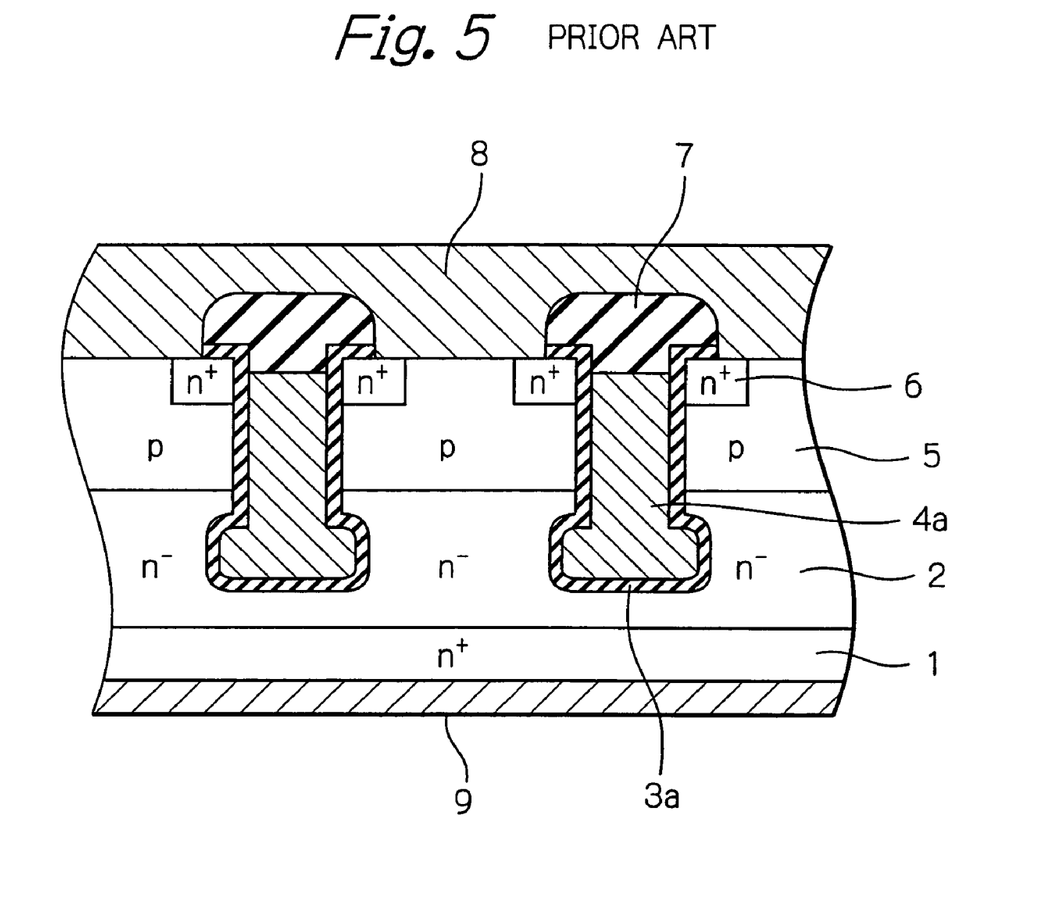
FIG. 5 is a cross-sectional view illustrating a third prior art semiconductor device.
Figure 6:
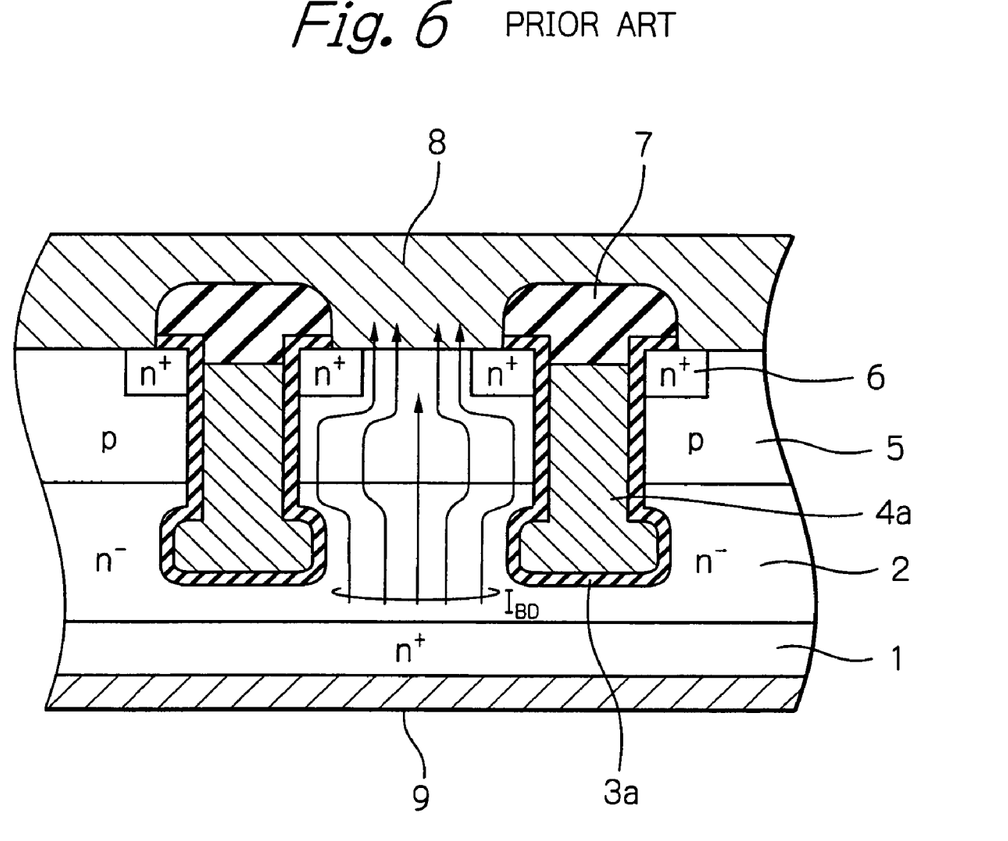
FIG. 6 is a cross-sectional view for explaining the current relaxation of a breakdown current in the semiconductor device of FIG. 5.

In FIG. 5, which illustrates a third prior art semiconductor device (see: JP-2001-244325-A), rounded hump openings are provided at the bottoms of trenches within the n$^-$-type epitaxial silicon layer 2 of FIG. 1, so that the gate silicon dioxide layers 3 and the gate electrodes 4 of FIG. 1 are replaced by gate silicon dioxide layers 3a and gate electrodes 4a which have rounded humps at their bottoms, thus relaxing the current concentration as illustrated in FIG. 6, which would suppress the reduction of a gate breakdown voltage.

In the semiconductor device of FIG. 5, however, it is impossible to avoid an avalanche breakdown phenomenon. That is, since the p-type base region 5 does not reach the rounded hump openings of the trenches, the breakdown current I$_{BD}$ flows through the p-type base region 5 beneath the n$^+$-type source impurity diffusion regions 6 as illustrated in FIG. 6 to turn ON the parasitic npn-type bipolar transistor T. Also, since the depth of the trenches is larger than that of the p-type base region 5, a non-flat depletion region is generated between the p-type base region 5 and the n$^-$-type epitaxial silicon layer 2 caused by a reverse bias voltage applied thereto, which would decrease the breakdown voltage. Further, since the current path of the MOS transistor Q is relatively long, its ON-resistance is increased.

Figure 7:
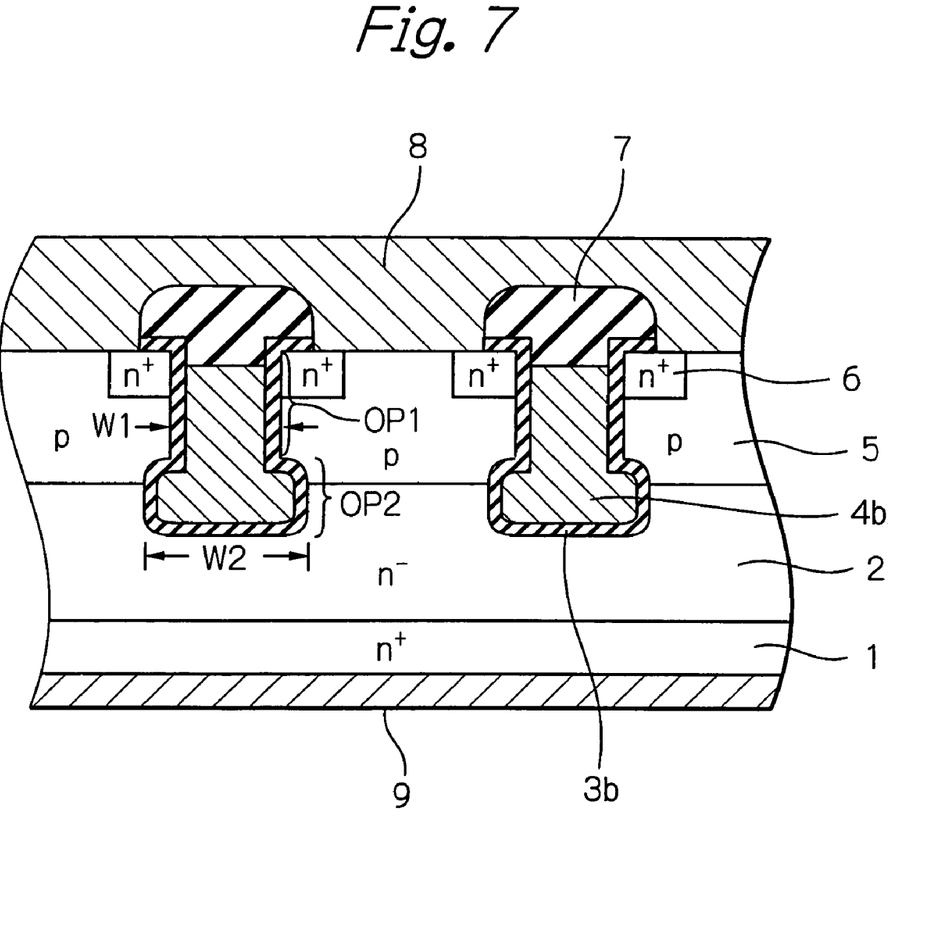
FIG. 7 is a cross-sectional view illustrating a first embodiment of the semiconductor device according to the present invention.
Figure 8:
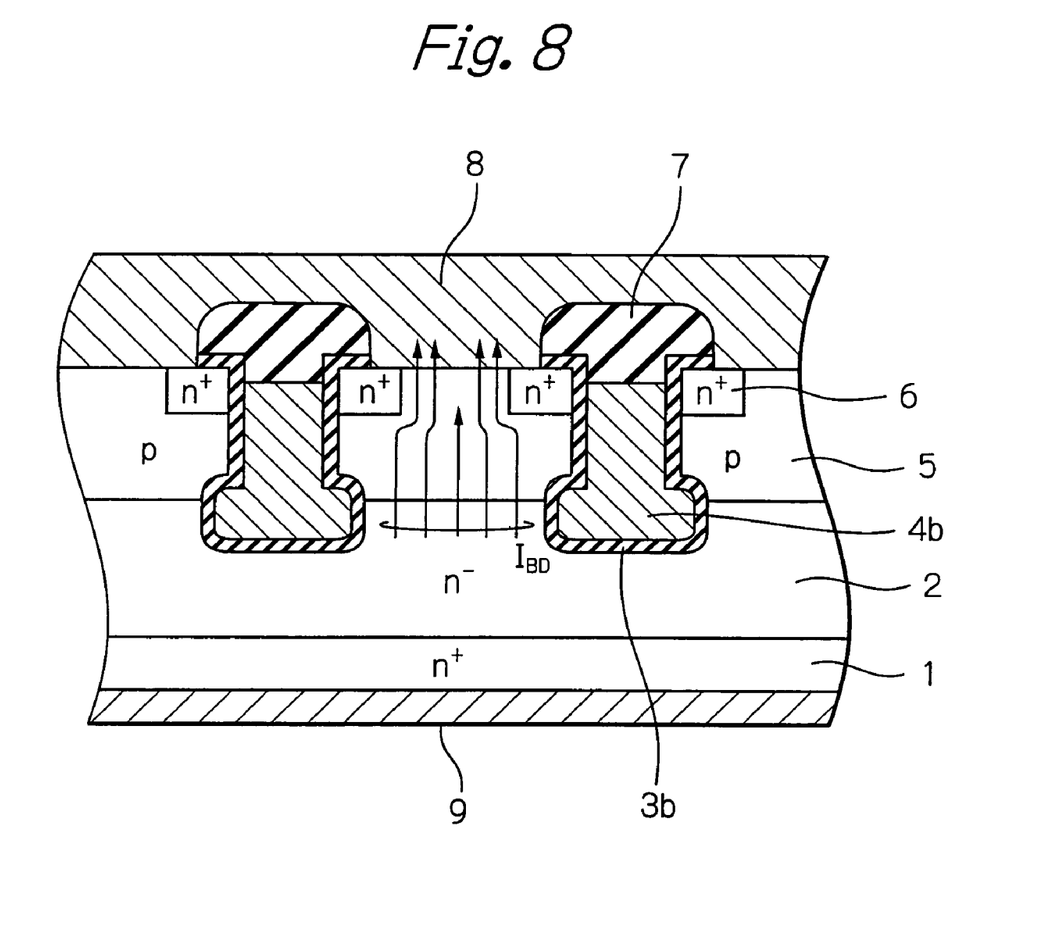
FIG. 8 is a cross-sectional view for explaining the current relaxation of a breakdown current in the semiconductor device of FIG. 7.

In FIG. 7, which illustrates a first embodiment of the semiconductor device such as a trench-type vertical MOS transistor according to the present invention, rounded hump openings are provided on the bottoms of trenches within a region between the n$^-$-type epitaxial silicon layer 2 and the p-type base region 5 of FIG. 1, so that the gate silicon dioxide layers 3 and the gate electrodes 4 of FIG. 1 are replaced by gate silicon dioxide layers 3b and gate electrodes 4b which have rounded humps within the region between the n$^-$-type epitaxial silicon layer 2 and the p-type base region 5. In more detail, one trench is constructed by an opening OP1 with a width W1 and a rounded hump opening OP2 with a width W2 larger than the width W1 below the opening OP1. The rounded hump opening OP2 has a curvature radius of larger than 0.1 μm. The bottom of the p-type base region 5 reaches the rounded hump opening OP2 of the trench. Thus, the current concentration is relaxed as illustrated in FIG. 8, which would suppress the reduction of a gate breakdown voltage.

Also, in the semiconductor device of FIG. 7, it is possible to avoid an avalanche breakdown phenomenon. That is, since the p-type base region 5 reaches the rounded hump openings of the trenches, the breakdown current I$_{BD}$ flows through the center portion of the p-type base region 5 so as not to increase the base voltage as illustrated in FIG. 8, which would not turn ON the parasitic npn-type bipolar transistor T. Further, since the depth of the trenches is not so large as that of the p-type base region 5, a flat depletion region is generated between the p-type base region 5 and the n$^-$-type epitaxial silicon layer 2 caused by a reverse bias voltage applied thereto, which would not decrease the breakdown voltage. Additionally, since the current path of the MOS transistor Q is relatively short, its ON-resistance can be decreased.

A method for manufacturing the semiconductor device of FIG. 7 will be explained next with reference to FIGS. 9A through 9L as well as FIG. 7.

Figure 9A:
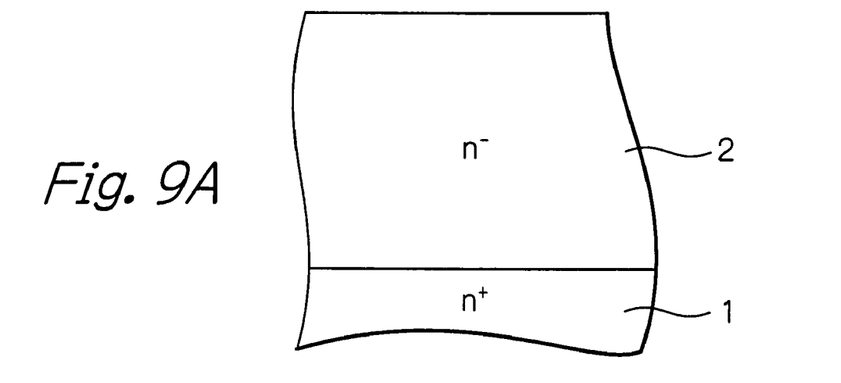
FIG. 9A through 9L are cross-sectional views for explaining a method for manufacturing the semiconductor device of FIG. 7.

First, referring to FIG. 9A, an n$^-$-type epitaxial silicon layer 2 is grown on an n$^+$-type monocrystalline silicon substrate 1.

Figure 9B:
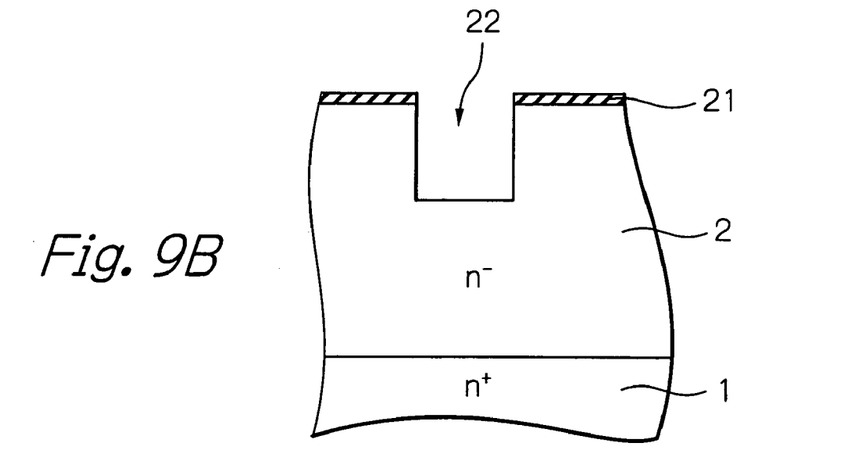

Next, referring to FIG. 9B, a silicon dioxide pattern layer 21 is formed on the n$^-$-type epitaxial silicon layer 2 by a thermal oxidation process or a chemical vapor deposition (CVD) process, and a photolithography and etching process. Then, the n$^-$-type epitaxial silicon layer 2 is etched by an anisotropic etching process using the silicon dioxide layer 21 as an etching mask, to form a trench 22. Note that the distance between the trench 22 and its adjacent trench (not shown) is about 1 to 10 μm.

Figure 9C:
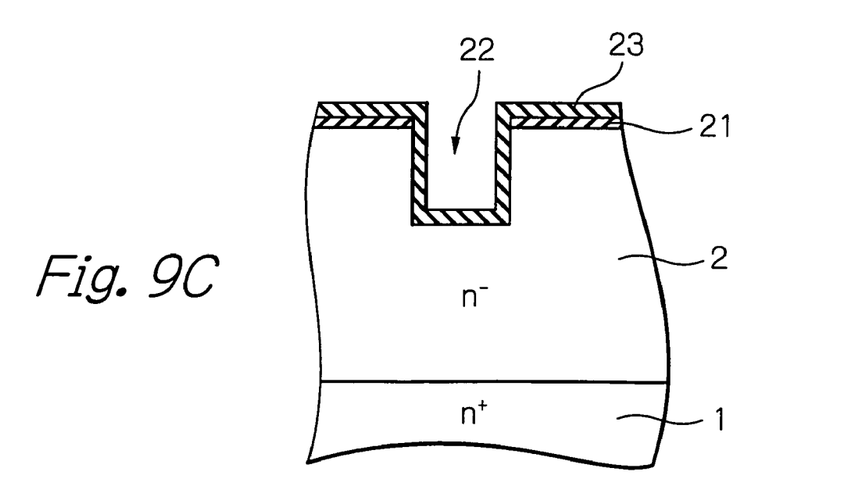

Next, referring to FIG. 9C, a silicon nitride layer 23 is deposited on the entire surface by a CVD process.

Figure 9D:
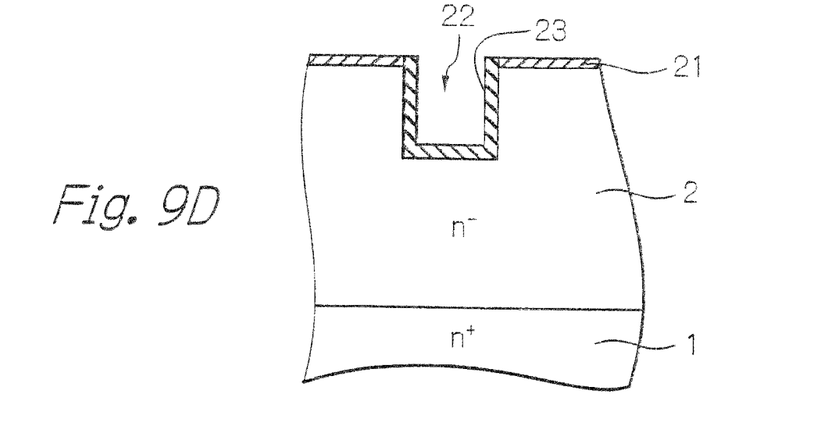

Next, referring to FIG. 9D, the silicon nitride layer 23 is etched back by an anisotropic etching process, so that the silicon nitride layer 23 is left only on the side wall of the trench 22.

Figure 9E:
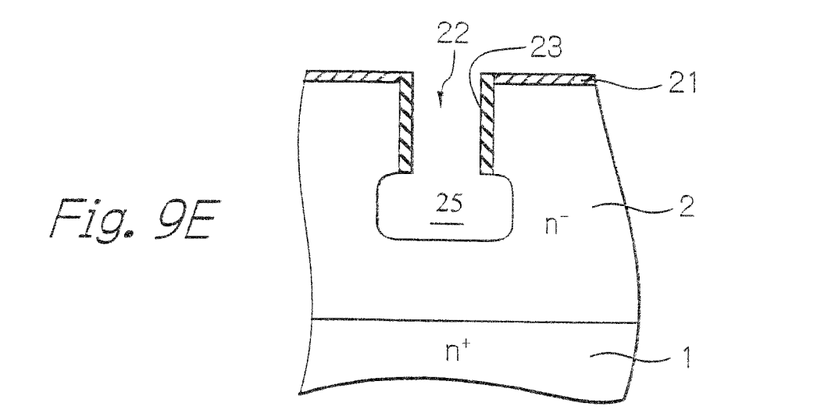

Next, referring to FIG. 9E, the n⁻-type epitaxial silicon layer 2 is etched by an isotropic etching process using the silicon dioxide layer 21 and the silicon nitride layer 23 as an etching mask, to form a rounded hump 25 on the bottom of the trench 22.

Figure 9F:
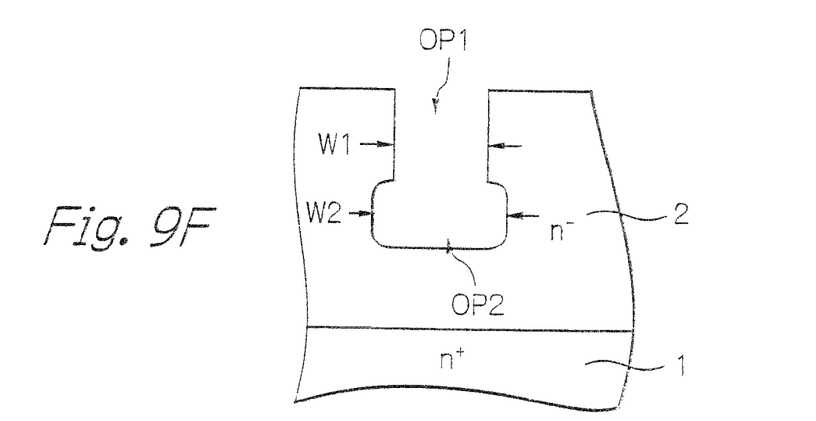

Next, referring to FIG. 9F, the silicon dioxide layer 21 and the silicon nitride layer 23 are removed by a wet etching process or the like. As a result, a trench including an opening OP1 with a width W1 and a rounded hump opening OP2 with a width W2 larger than the width W1 is formed in the n⁻-type epitaxial silicon layer 2.

Figure 9G:
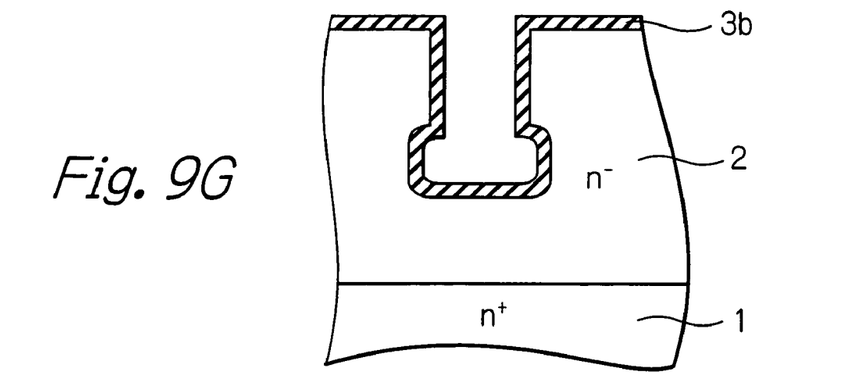

Next, referring to FIG. 9G, a gate silicon dioxide layer 3b is formed by a thermal oxidation process.

Figure 9H:
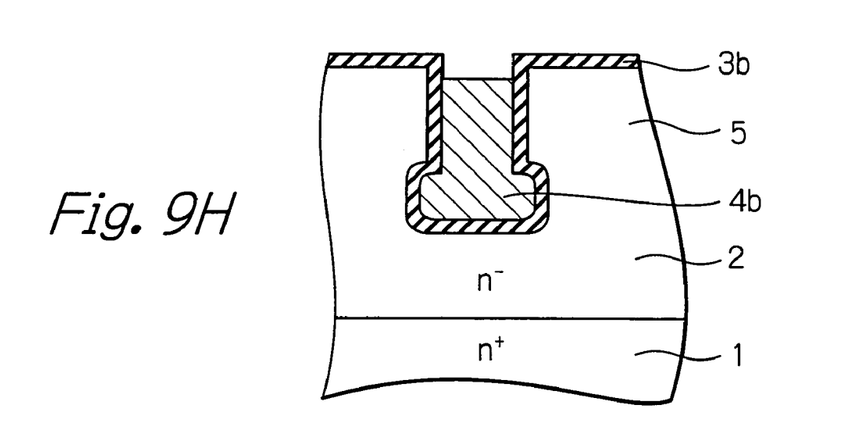

Next, referring to FIG. 9H, a polycrystalline silicon layer is deposited by a CVD process, and the polycrystalline silicon layer is etched by a dry etching process, to form a gate electrode 4b buried in the trench.

Figure 9I:
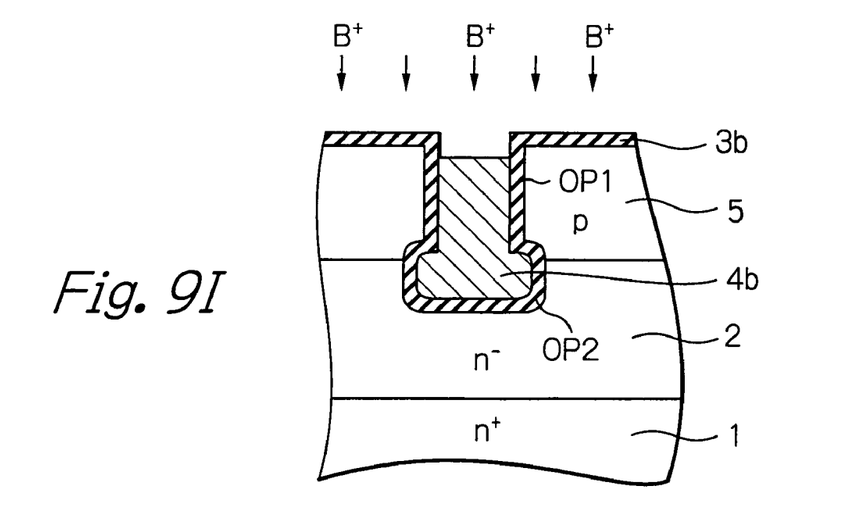

Next, referring to FIG. 9I, boron ions are implanted into the n⁻-type epitaxial silicon layer 2, so that a p-type base region 5 is formed therein. In this case, the energy of the boron ions is adjusted so that the bottom of the p-type base region 5 reaches the rounded hump opening OP2 of the trench. For example, the p-type base region 5 is about 0.4 to 2.0 μm in depth while the trench is about 1.4 to 3.0 μm in depth.

Figure 9J:
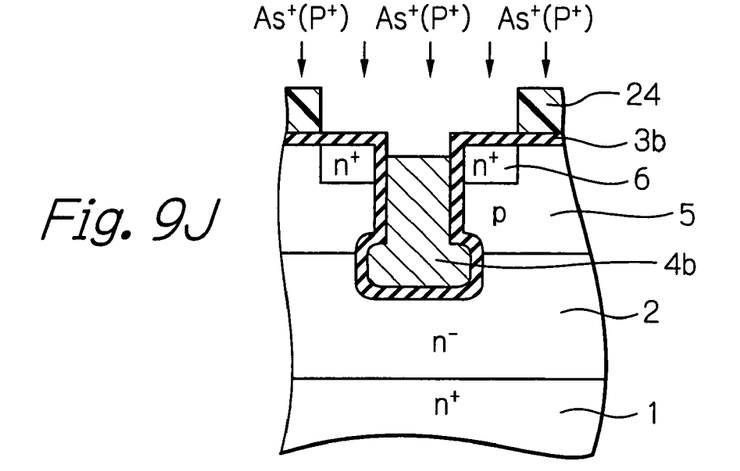

Next, referring to FIG. 9J, a photoresist pattern layer 24 is formed by a photolithography process, and arsenic (or phosphorus) ions are implanted into the p-type base region 5 by using the photoresist pattern layer 24 to form n⁺-type source impurity diffusion regions 6 which are about 0.05 μm in depth. Then, the photoresist pattern layer 24 is removed by an ashing process or the like.

Figure 9K:
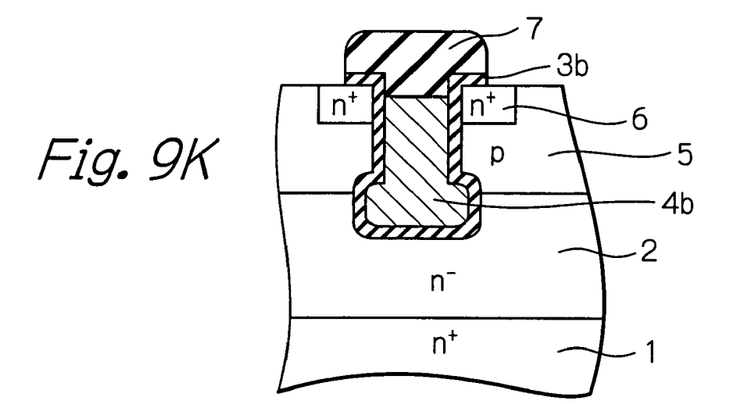

Next, referring to FIG. 9K, an insulating layer 7 made of silicon dioxide is formed. Then, the insulating layer 7 as well as the gate silicon dioxide layer 3b is patterned by a photolithography and etching process.

Figure 9L:
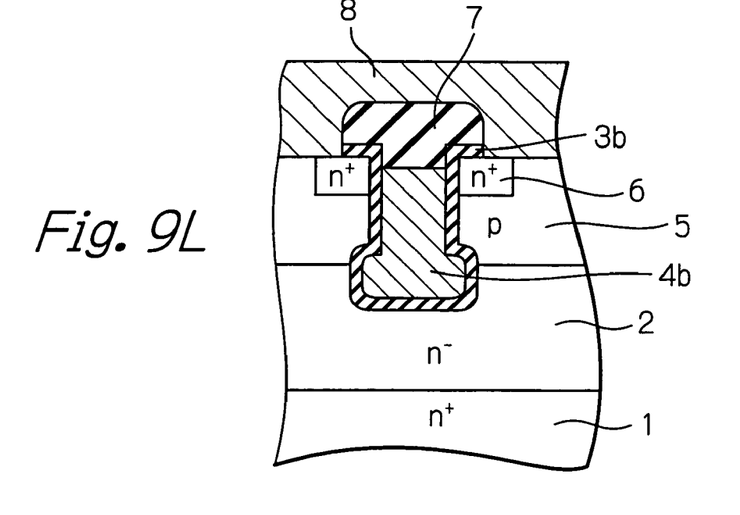

Next, referring to FIG. 9L, a source electrode 8 is formed on the front face and is connected to the n⁺-type source impurity diffusion region 6.

Finally, referring to FIG. 7, the back face of the silicon substrate 1 is etched, and a drain electrode 9 is formed on the back face.

Note that, after the p-type base region 5 and the n⁺-type source impurity diffusion regions 6 are formed as illustrated in FIGS. 9I and 9J, the gate silicon dioxide layer 3b and the gate electrode 4b can be formed as illustrated in FIGS. 9G and 9H.

Figure 10:
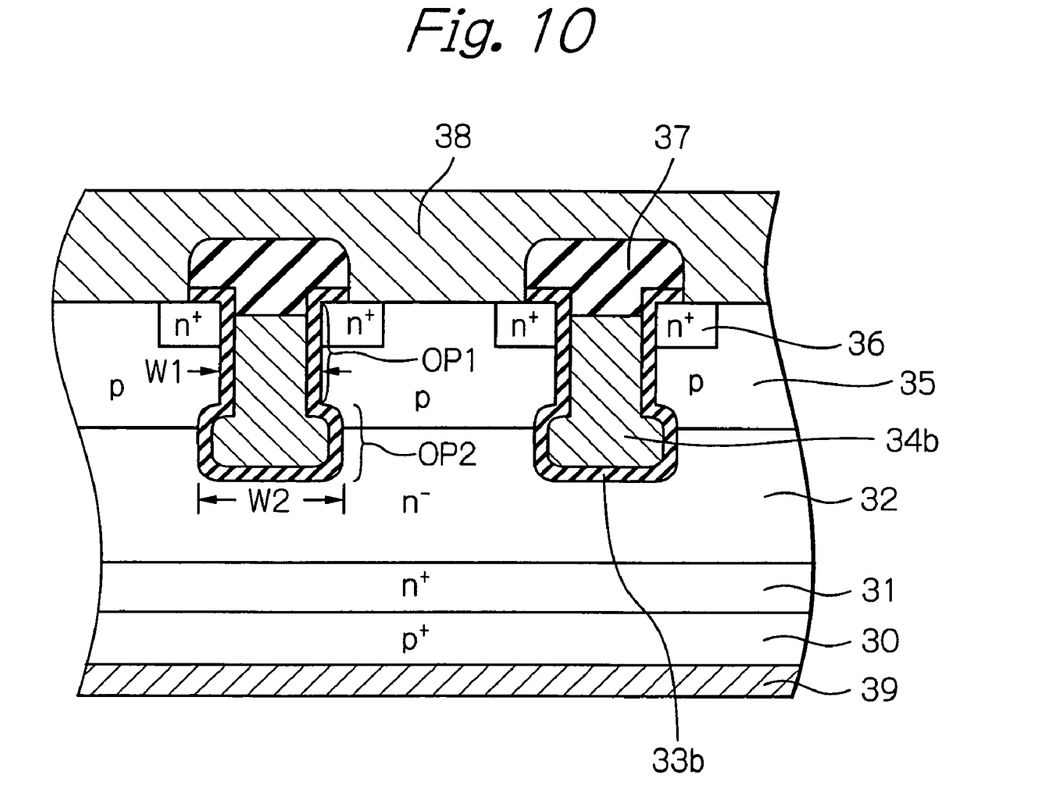
FIG. 10 is a cross-sectional view illustrating a second embodiment of the semiconductor device according to the present invention.

In FIG. 10, which illustrates a second embodiment of the semiconductor device such as a trench-type vertical IGBT according to the present invention, the n⁺-type monocrystalline silicon substrate 1, the n⁻-type epitaxial silicon layer 2, the gate silicon dioxide layer 3b, the gate electrodes 4b, the p-type base region 5, the n⁺-type source impurity diffusion regions 6, the insulating layers 7, the source electrode 8 and the drain electrode 9 of FIG. 7 correspond to an n⁺-type buffer 31, an n⁻-type base layer 32, a gate silicon dioxide layer 33b, gate electrodes 34b, a p-type base region 35, an n⁺-type emitter impurity diffusion regions 36, insulating layers 37, an emitter electrode 38 and a collector electrode 39, respectively. Also, an n⁺-type collector region 30 is provided between the n⁺-type buffer 31 and the collector electrode 39.

Figure 11:
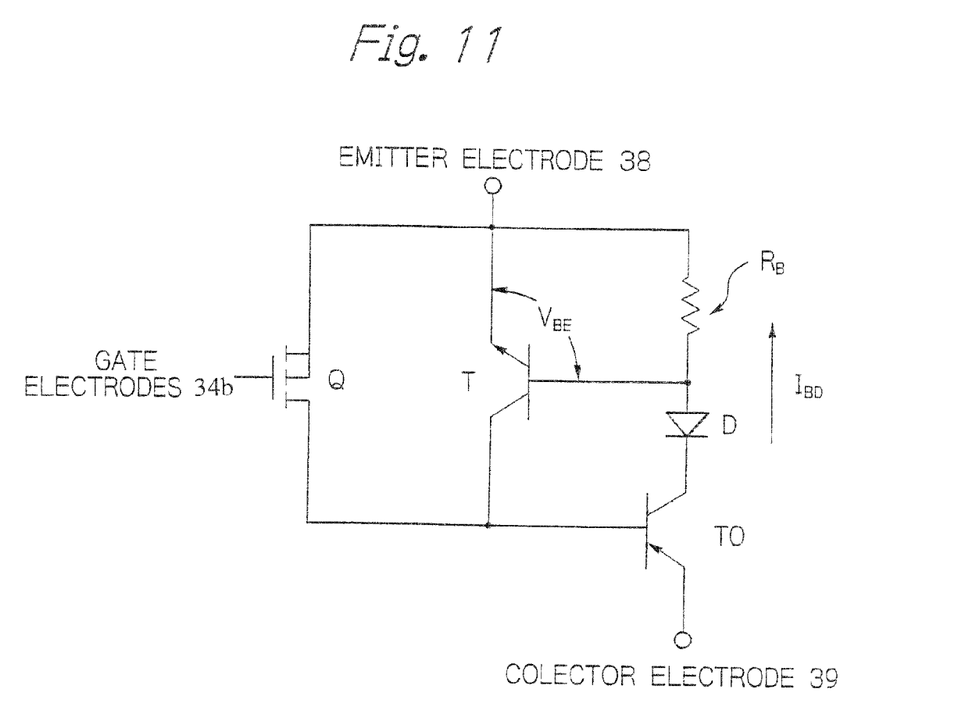
FIG. 11 is an equivalent circuit diagram of the semiconductor device of FIG. 10.

As illustrated in FIG. 11, which is an equivalent circuit diagram of the semiconductor device of FIG. 10, the n⁺-type emitter impurity diffusion regions 36, the gate electrodes 34b and the n⁻-type base 31 form a MOS transistor Q, and the n⁺-type emitter impurity diffusion regions 36, the p-type base region 35 and the n⁻-type base region 32 form a parasitic npn-type bipolar transistor T. Also, the p-type base region 35, the n⁻-type base region 32 (the n⁺-type buffer 31) and the collector region 39 form an npn-type bipolar transistor T0. Further, in FIG. 11, reference D designates a pn diode formed by the p-type base region 35 and the n⁻-type base region 32, and $R_B$ designates a base resistance defined by the p-type base region 35 surrounded by the n⁺-type emitter impurity diffusion region 36.

Even in FIG. 10, rounded hump openings are provided of the bottoms of trenches within a region between the n⁻-type base region 32 and the p-type base region 35, so that the gate silicon dioxide layers 33b and gate electrodes 34b which have rounded humps at their bottoms within the region between the n⁻-type base region 32 and the p-type base region 35. In more detail, one trench is constructed by an opening OP1 with a width W1 and a rounded hump opening OP2 with a width W2 larger than the width W1 below the opening OP1. The rounded hump opening OP2 has a curvature radius of larger than 0.1 μm. The bottom of the p-type base region 35 reaches the rounded hump opening OP2 of the trench. Thus, the current concentration is relaxed in the same way as in FIG. 8, which would suppress the reduction of a gate breakdown voltage.

Also, in the semiconductor device of FIG. 10, it is possible to avoid an avalanche breakdown phenomenon. That is, since the p-type base region 35 reaches the rounded hump openings of the trenches, the breakdown current $I_{BD}$ flows through the center portion of the p-type base region 35 so as not to increase the base voltage in the same way as in FIG. 8, which would not turn ON the parasitic npn-type bipolar transistor T. Further, since the depth of the trenches is not as large as that of the p-type base region 35, a flat depletion region is generated between the p-type base region 35 and the n⁻-type base region 32 caused by a reverse bias voltage applied thereto, which would not decrease the breakdown voltage. Additionally, since the current path of the MOS transistor Q is relatively short, its ON-resistance can be decreased.

Further, the semiconductor device of FIG. 10 can be manufactured by a similar method as illustrated in FIGS. 9A through 9L except that the p⁺-type collector region 30 is provided as a p⁺-type monocrystalline silicon substrate and the n⁺-type buffer 31 is provided as an n⁺-type epitaxial silicon layer.

In the above-described embodiments, the MOS transistor Q is of an n-channel type, the parasitic bipolar transistor T is of an npn-type, and the bipolar transistor T0 is of a pnp-type; however, the present invention can be applied to semiconductor devices where the MOS transistor Q is of a p-channel type, the parasitic bipolar transistor T is of a pnp-type, and the bipolar transistor T0 is of an npn-type.

The invention claimed is:

1. A semiconductor device including a vertical transistor with an upper first electrode and a lower second electrode, the device comprising:

an upper semiconductor region of a first conductivity type, said upper semiconductor region having spaced-apart diffusion regions at a top surface thereof directly adjacent to said first electrode;

a lower semiconductor region of a second conductivity type that is different than the first conductivity type, said lower semiconductor region being closer to said lower second electrode than said upper semiconductor region;

a trench formed in said upper and lower semiconductor regions between said diffusion regions, said trench having an upper portion that throughout a majority of said upper semiconductor region has a first width, a lower portion having a second width larger than the first width, and a middle portion between the upper and lower portions having a width that enlarges from the first width to the second width, wherein said lower portion having the second width is present in each of said upper and lower semiconductor regions; and a gate electrode buried in said upper, middle, and lower portions of said trench of said device.

2. The semiconductor device as set forth in claim 1, wherein the middle portion has a radius of curvature larger than about 0.1 µm.

3. The semiconductor device as set forth in claim 1, wherein said lower semiconductor region is directly beneath said upper semiconductor region, and wherein the middle portion is located entirely in said upper semiconductor region.

4. The semiconductor device as set forth in claim 3, wherein the middle portion has a radius of curvature larger than about 0.1 µm.

5. The semiconductor device as set forth in claim 3, wherein said gate electrode is part of a trench-type MOS transistor.

6. The semiconductor device as set forth in claim 3, wherein said gate electrode is part of a trench-type insulated gate bipolar transistor (IGBT).

7. The semiconductor device as set forth in claim 6, wherein said upper semiconductor region is a semiconductor base region.

* * * * *